United States Patent [19]

Goto et al.

[11] 4,430,416
[45] Feb. 7, 1984

[54] TRANSFER ELEMENT FOR SANDBLAST CARVING

[75] Inventors: Hiraku Goto, Owariasahi; Tsuneaki Usui, Nagoya; Nobuyasu Kinoshita, Hirakata, all of Japan

[73] Assignees: Asahi Kasei Kogyo Kabushiki Kaisha, Osaka; Akebono Process Co. Ltd., Aichi, both of Japan

[21] Appl. No.: 163,546

[22] Filed: Jun. 27, 1980

[51] Int. Cl.³ .................. B24C 1/04; B44C 1/22; G03C 11/12; G03F 7/26
[52] U.S. Cl. .................. 430/263; 51/310; 51/311; 51/312; 156/659.1; 430/258; 430/259; 430/262; 430/323
[58] Field of Search .......... 51/262.1, 310, 311, 51/312; 430/260, 262, 263, 323; 156/659.1

[56] References Cited

U.S. PATENT DOCUMENTS

| | | | |
|---|---|---|---|
| 2,094,025 | 9/1937 | Scantlebury | 51/312 |
| 2,292,996 | 8/1942 | Helgeson | 41/39 |
| 2,544,905 | 3/1951 | Van Deusen | 430/325 |
| 2,617,225 | 11/1952 | O'Brien | 41/39 |
| 3,295,263 | 1/1967 | Savoca | 51/262 |
| 3,579,926 | 5/1971 | Gaspari | 51/262 |
| 3,808,751 | 5/1974 | Usui | 51/312 |
| 3,916,050 | 10/1975 | Kurhajec | 51/262 |

FOREIGN PATENT DOCUMENTS

| | | | |
|---|---|---|---|
| 46-35681 | of 1971 | Japan | |
| 46-35681 | 10/1971 | Japan | |
| 46-71126 | 10/1971 | Japan | 430/323 |
| 53-99258 | 8/1978 | Japan | 51/312 |

*Primary Examiner*—Dennis L. Albrecht
*Attorney, Agent, or Firm*—Sprung, Horn, Kramer & Woods

[57] ABSTRACT

A transfer element for sandblast carving comprising, in order, a flexible substrate, an intermediate resin layer which is strippable from the flexible substrate and is a pressure-sensitive adhesive to an etchable material, and a resist comprising a photocured photosensitive resin.

8 Claims, 13 Drawing Figures

TRANSFER ELEMENT FOR SANDBLAST CARVING

BACKGROUND OF THE INVENTION

1. Field of the Invention

This invention relates to a transfer element for sandblast carving.

2. Description of the Prior Art

In sandblast carving, a sheet material capable of becoming a resist stencil such as rubber sheet is affixed to the surface of an article to be carved such as glass, stone, plastics, ceramic ware, metal and wood and a design or pattern is manually cut out with a carving chisel from the sheet material or a resist stencil having a stenciled design or pattern to be carved is affixed to the surface of an article to be carved. Then a jet of hard particles such as carborundum, corundum, siliceous sand and glass beads is directed against the face of the article to be carved, resulting an intaglio image in the article corresponding to the original pattern. However, a great deal of skill and time is required for manually reproducing intricate designs. In order to improve such a problem, there has been proposed a method of forming a resist stencil having a stenciled design on an article to be carved which comprises forming a photosensitive resin layer on the surface of an article to be carved, exposing the photosensitive resin layer to actinic light through an image-bearing transparency such as a positive film and removing unexposed portions of the photosensitive resin layer (see Japanese Patent Publication No. 35681/1971). According to this method, it is necessary that a photosensitive resin composition is directly coated on the surface of an article to be carved and then an image-forming exposure to actinic light is conducted. However, such procedures as coating of the photosensitive resin composition, exposure to actinic light and removal of unexposed portions of the photosensitive resin layer are complicated and take time especially with a large article to be carved. In some cases, the solvent or solution which is used as a washing solution for removing unexposed portions of the photosensitive resin layer usually contacts the article to be carved directly and, as a result, damages or spoils the surface of the article. On the other hand, a photosensitive resin layer is formed on a substrate and the photosensitive resin layer is exposed to actinic light through an image-bearing transparency and unexposed portions of the photosensitive resin layer are removed and then the substrate is stripped to form a resist having a stenciled design. But it is difficult to form a resist having a stenciled design of independent letters and patterns.

It is an object of this invention to provide a resist having a stenciled design for sandblast carving which avoids the above described difficulties.

SUMMARY OF THE INVENTION

This object is realized in accordance with the present invention pursuant to which there is provided a transfer element having, in order, a flexible substrate, an intermediate resin layer which is strippable from the substrate and is pressure-adhesive to the surface of an etchable material, and a resist comprising a photocured photosensitive resin composition.

DETAILED DESCRIPTION OF THE INVENTION

Figure 1:
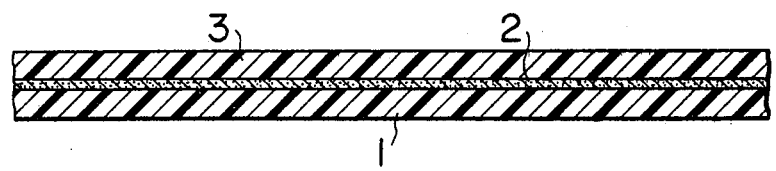
FIG. 1 is a side sectional view of an original element from which a transfer element for sandblast carving in accordance with this invention is prepared.

In FIG. 1 reference numeral 1 represents a flexible substrate; 2 an intermediate resin layer provided on the substrate; and 3 a photosensitive resin composition layer which is provided on the intermediate resin layer 2 and can be photocured by the action of actinic light. The intermediate resin layer 2 does not necessarily have an adhesion to the photosensitive resin composition layer 3, but is required to have some adhesion to the resist which is the photocured portion of the photosensitive resin composition layer 3 after an imagewise exposure to actinic light and is designated as 7 in FIGS. 3(A) and 3(B). Also the intermediate resin layer 2 is rendered strippable from the substrate 1. For these two purposes it may be possible to make the intermediate resin layer two layers 2a and 2b as shown in FIG. 6, for example, by twice coating the same or different intermediate resin on the substrate 1. In this case, the intermediate resin layer 2b which contacts the photosensitive resin composition layer 3 has an adhesion to the resist 7 which is the photocured portion of the photosensitive resin composition layer 3 as well as to the surface 17 of an article 16 to be carved in FIGS. 4, 5, 9, 10 and 11 by pressure and the intermediate resin layer 2a has a weaker adhesion to the substrate 1 and is rendered strippable from the substrate 1. When the intermediate resin layer 2 has a strong adhesion to the resist 7 and is strippable from the substrate 1, the intermediate resin layer 2b may be the same as the intermediate resin 2a.

Figure 2:
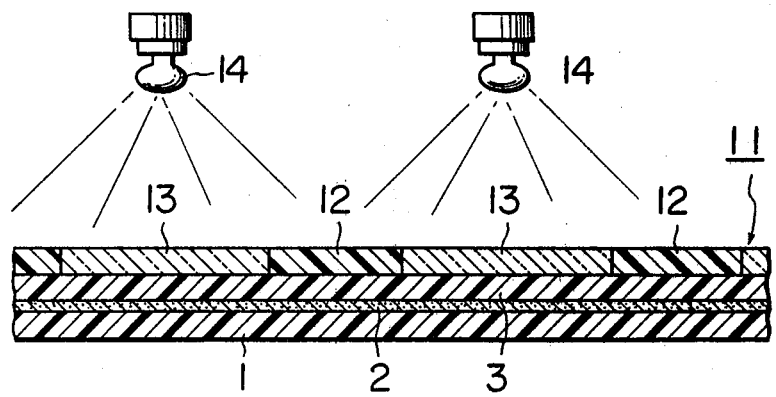
FIG. 2 is a schematic view illustrating the step of printing a photo positive design on the original element of FIG. 1.
Figure 3A:
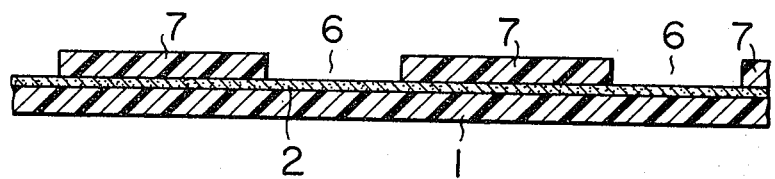
FIGS. 3(A) and 3(B) are side sectional views of the transfer elements for sandblast carving in accordance with this invention.
Figure 3B:
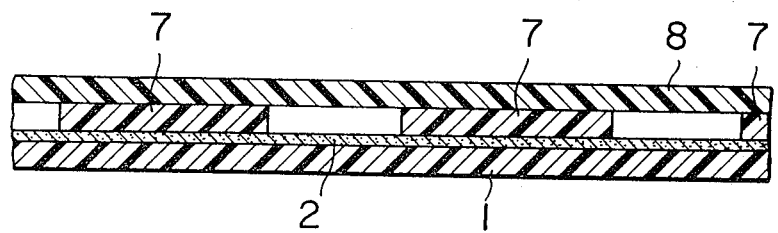
Figure 7:
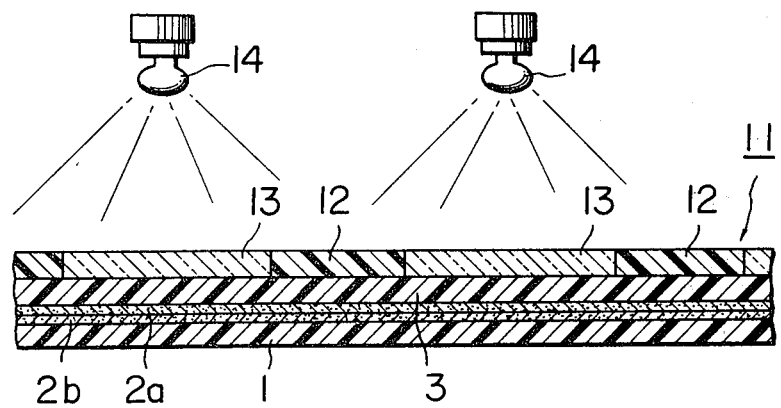
FIG. 7 is a schematic view illustrating the step of printing a photo positive design on the original element of FIG. 6.
Figure 8A:
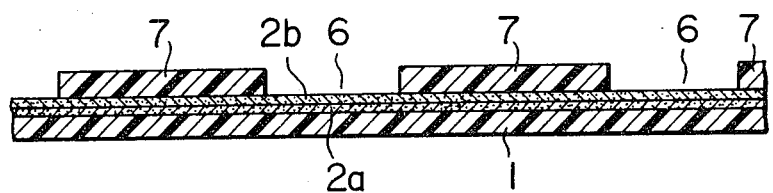
FIGS. 8(A) and 8(B) are side sectional views of the transfer elements for sandblast carving in accordance with this invention.
Figure 8B:
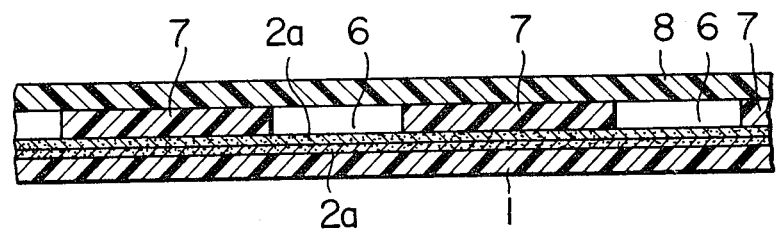

In FIGS. 2 and 7, an image-bearing transparency 11 such as a positive film where patterns are given as opaque portions 12 is placed on the photosensitive resin layer 3 and actinic light from its light source 14 is irradiated to the photosensitive resin layer 3 through the transparent portions 13 of the image-bearing transparency 11. Then unexposed portions corresponding to the opaque portions 12 are removed, resulting in a transfer element for sandblast carving in accordance with this invention where stenciled patterns 6 corresponding to the opaque portions 12 of the image-bearing transparency 11 appear in the intermediate resin layer 2 or 2b and the resist 7 which is the photocured portion of the photosensitive resin layer 3 surrounds the stenciled patterns 6 as shown in FIGS. 3(A) and 8(A). The transfer element for sandblast carving of this invention may be covered with a protective film or sheet 8 as shown in FIGS. 3(B) and 8(B) from the viewpoint of storage or transport and the protective film is peeled off prior to use of the transfer element.

Figure 4:
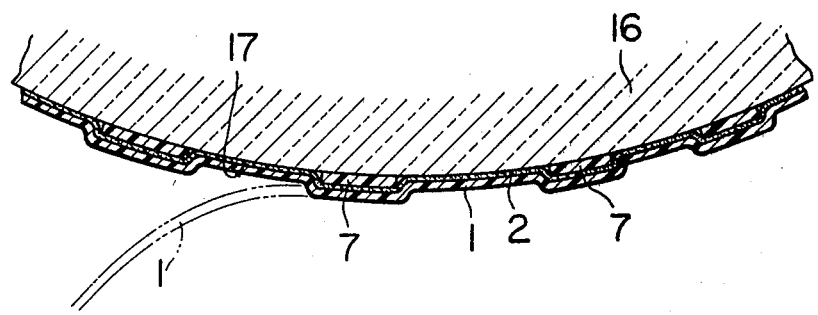
FIG. 4 is a fragmentary sectional view illustrating the step of transferring the resist of the transfer element for sandblast carving of FIG. 3(A) onto the surface of an article to be carved.
Figure 5:
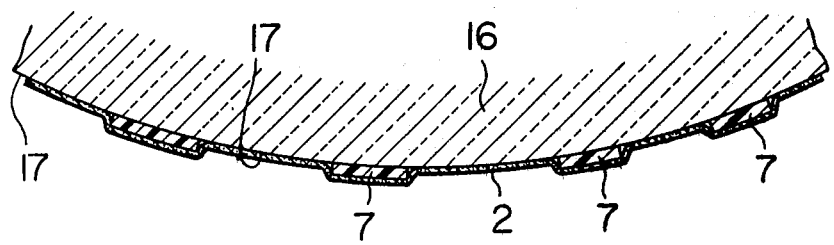
FIG. 5 is a fragmentary sectional view of the resist and the intermediate resin layer of the transfer element for sandblast carving, which are affixed on the article and from which the substrate is stripped from the intermediate resin layer.
Figure 6:
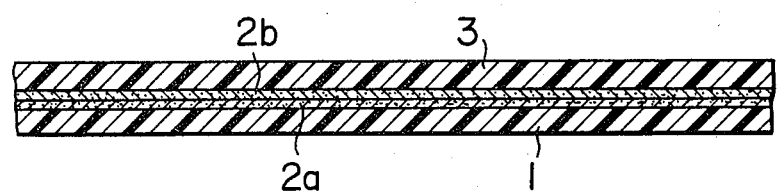
FIG. 6 is a side sectional view of an original element from which another transfer element for sandblast carving in accordance of this invention is prepared.
Figure 9:
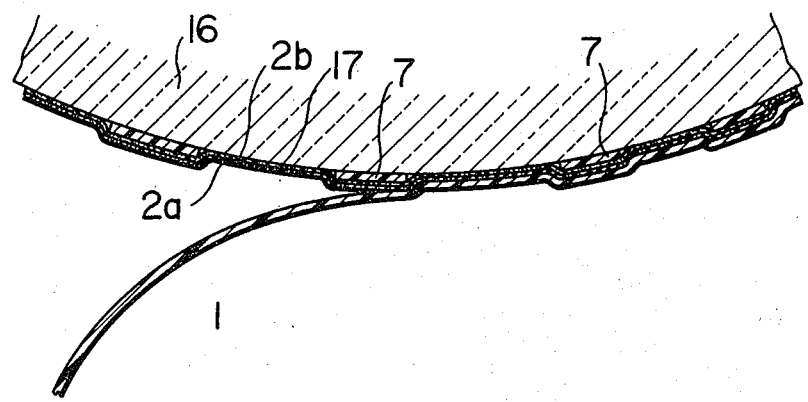
FIG. 9 is a fragmentary sectional view illustrating the step of transferring the resist and the intermediate resin layer of the transfer element for sandblast carving of FIG. 8(A) onto the surface of an article to be carved.

In sandblast carving, the transfer element for sandblast carving is sufficiently pressed and adhered onto the planar or non-planar surface 17 of an article 16 to be carved in such a manner that the resist 7 and the intermediate resin layer 2 or 2b appearing at the bottom of the stenciled patterns 6 tightly contact the surface 17 as shown in FIGS. 4 and 9 and then the substrate 1 is stripped from the intermediate resin layer 2 or 2a, resulting in the transfer of the resist 7 and the intermediate resin layer 2 or 2a and 2b onto the surface 17 as shown in FIGS. 5 and 9.

Figure 10:
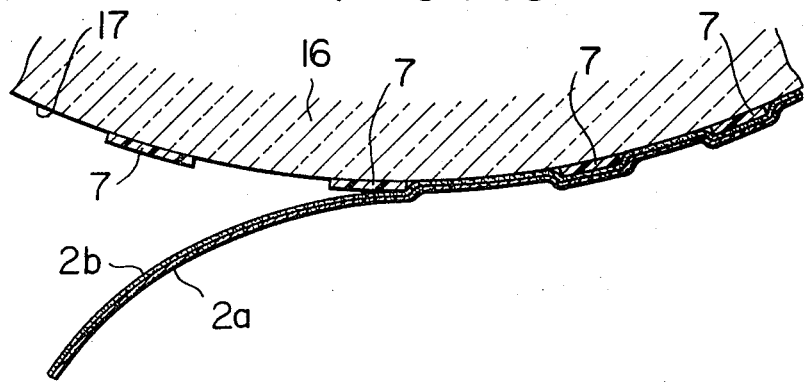
FIG. 10 is a fragmentary sectional view illustrating the step of transferring only the resist of the transfer element for sandblast carving of FIG. 8(A) onto the surface of an article to be carved.

When fine and intricate patterns to be carved are surrounded with a resist, it is not necessarily easy to break a thick intermediate resin layer covering the patterns by a jet of hard particles and to roughen or carve the surface of an article and as a result, indistinct parts tend to appear in the carved patterns. In this case, the adhesion between the intermediate resin layer 2 or 2b and the resist 7 is reduced and the intermediate resin layer 2 or 2b is made strippable from the resist 7, and the relationship of adhesion A between the substrate 1 and the intermediate resin layer 2 or 2a, adhesion B between the intermediate resin layer 2 or 2b and the resist 7 and adhesion C between the resist 7 and the surface 17 of an article 16 is adjusted to satisfy $A<B<C$. After the transfer element for sandblast carving is intimately contacted with the surface 17 of an article 16 to be carved, the substrate 1 and the intermediate resin layer 2a and 2b are successively removed or stripped to transfer only the resist 7 onto the surface 17 as shown in FIGS. 9, 10 and 11.

In general, however, when the thickness of the intermediate resin layer is rended sufficiently thin, most of the designs or patterns can be carved.

Figure 11:
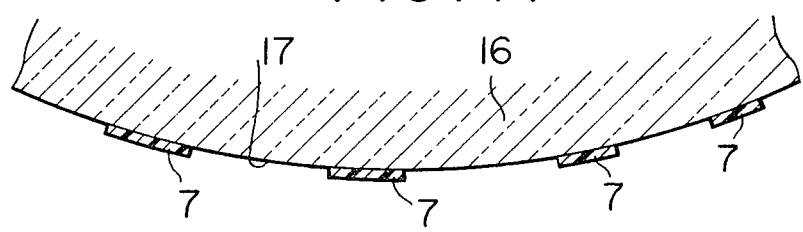
FIG. 11 is a fragmentary sectional view illustrating the resist adhered to the surface of an article to be carved.

After the resist 7 alone or together with the intermediate resin layer 2 or 2a and 2b are transferred onto the surface 17 of an article 16 to be carved as in FIGS. 11, 5 and 9, a jet of hard particles is directed against the fact of the resist 7 or the intermediate resin layer 2 or 2a and 2b to break and remove the intermediate resin layer 2 or 2a and 2b, if present as in FIGS. 5 and 9, and to carve the surface 17 other than that to which the resist 7 is adhered.

The substrates which can be employed in this invention may be any flexible material and can be selected within wide limits.

Exemplary flexible substrates include plastic films and sheets such as polyethylene terephthalate, polyethylene, polypropylene, polyvinyl chloride and cellulose acetate, paper, cellophane film and aluminum foil.

The thickness of the substrates is not particularly limited and preferably ranges from about 0.02 to about 1 mm from the standpoint of their flexibility.

The intermediate resin layer of this invention is strippable from the flexible substrate, and it is preferred that the peel off strength of the intermediate resin layer is at most about 500 g/cm. When the peel off strength is more than about 500 g/cm, it is impossible to strip the intermediate resin layer from the substrate. Since the adhesion of the intermediate resin layer to the resist is necessary to some extent, the peel off strength is preferably at least about 50 g/cm and more than the strength between the intermediate resin layer and the substrate. When the peel off strength between the intermediate resin layer and the resist is less than about 50 g/cm, smooth stripping of the substrate becomes impossible and in some cases the resist of a photocured photosensitive resin is removed in the removal of unexposed portions of the photosensitive resin layer after photocuring by the action of actinic light.

The resins for forming the intermediate resin layer which can be employed include acrylic resins such as copolymers of ethyl acrylate, buty acrylate, 2-ethylhexyl acrylate or acrylonitrile, polyvinyl acetate, polyvinyl alcohol, polyvinyl butyral, vinyl chloride-vinyl acetate copolymer, polyamide, polyvinylidene chloride, low molecular weight polyethylene, polyester acrylate, polyvinyl pyrrolidone, natural rubber, rubber chloride, cyclized rubber, styrene-butadiene copolymer, butadiene-acrylonitrile copolymer, butyl rubber, chloroprene rubber, silicone rubber, cellulose carboxylate, polyurethane, alkyd resin and unsaturated polyester.

The intermediate resin layer of this invention can be formed on the flexible substrate by coating a solution, emulsion or latex of the above described resin on the flexible substrate and drying the formed intermediate resin. In order to adjust the adhesion of the intermediate resin to the resist of a photocured photosensitive resin and the flexible substrate as described above, silicone oil and wax can be employed together with the resin.

It is preferred that the thickness of the intermediate resin layer is about 0.001 to about 1 mm in order to smoothly conduct transfer of the resist by tightly contacting the intermediate resin layer even with complicated non-planar surfaces of an article to be etched by pressure and stripping the flexible substrate from the adhered intermediate resin layer. When the thickness of the intermediate resin layer is greater than about 1 mm, it is difficult to smoothly conduct transfer of the resist to an article to be etched. On the other hand, when the thickness is smaller than about 0.001 mm, the advantageous effect of the intermediate resin layer becomes small.

The photosensitive resin composition capable of forming a resist which can be used in the present invention is a resin which is cured upon exposure to actinic light, or which has reduced solubility in a solvent as compared to its solubility before exposure to actinic light. Such a photosensitive resin composition, for example, comprises a compound containing an addition-polymerizable unsaturated group as the main ingredient and a photopolymerization initiator. There is no particular limitation on the properties of these components so long as a photocurable composition of sufficient mechanical strength to be useful is achieved, nor is there any special limitation in the molecular weight of the resulting photopolymer.

Examples of such compounds containing an addition-polymerizable group are acrylic acid, methacrylic acid, esters of these acids, for example, alkyl, cycloalkyl, tetrahydrofurfuryl, allyl, glycidyl or hydroxyalkyl acrylates or methacrylates, mono- or di-acrylates and methacrylates of alkylene glycols or polyoxyalkylene glycols, trimethylolpropane triacrylate and methacrylate and pentaerythritol tetraacrylate and methacrylate; acrylamide, methacrylamide or their derivatives such as N-methylol acrylamide and methacrylamide, N,N'-alkylene bisacrylamides and methacrylamides, and diacetone acrylamide and methacrylamide; addition-polymerizable unsaturated monomers such as styrene, vinyl toluene, divinyl benzene, diallyl phthalate, triallyl cyanurate, vinyl acetate or acrylonitrile; unsaturated polyesters; alkyd resins; and unsaturated polyurethane resins such as polyurethane resins modified with an addition-polymerizable unsaturated monomer having an active hydrogen such as a hydroxyalkyl acrylate or methacrylate.

Examples of photopolymerization initiators are benzoin, benzoin alkyl esters, α-methylbenzoin and alkyl ethers, α-phenylbenzoin, α-allybenzoin, anthraquinone, chloroanthraquinone, methylanthraquinone, ethylanthraquinone, benzil, diacetyl, acetophenone, ω-bromoacetophenone, α-naphthalenesulfonyl chloride, diphenyl disulfide, and dyes such as eosine or thionine.

The photosensitive resin composition comprises at least one compound containing an addition-polymerizable unsaturated group and a photopolymerization initiator, and, if desired, a heat polymerization inhibitor to increase storage stability such as hydroquinone, p-methoxy phenol, catechol, tert-butyl hydroquinone, benzoquinone, p-phenylenediamine, picric acid, or phenothiazine.

Examples of such photosensitive resin compositions are disclosed in U.S. Pat. Nos. 2,760,863; 2,902,365; 2,927,023; 2,929,710; 2,972,540; 2,997,391; 3,695,877; 3,677,920; 3,858,510; 3,960,572; 4,006,024; and 4,192,684.

There can also be used a composition comprising a polymeric compound which is soluble in water or an alkaline aqueous solution or an organic solvent, such as polyvinyl alcohol, polyvinyl alcohol derivatives, cellulose derivatives, polyacrylic acid, polyacrylamide, an alcohol-soluble polyamine or a water-soluble polyamide, the addition-polymerizable unsaturated compound and the photopolymerization initiator, and, if desired, a heat polymerization inhibitor, and the composition comprising a polyene, a polythiol and a photosensitizer as disclosed in Japanese Patent Publication No. 29525/71.

The polymeric compound mentioned above serves to increase the physical properties and the washing-out capability after photocuring and to solidify the resin composition at room temperature prior to photocuring (since most of the unsaturated compounds are liquid at room temperature). It is preferably used in an amount of about 90 wt % or less of the composition weight.

The sources of actinic light for exposure which can be used in the preparation of the resist in this invention can be freely selected and include, for example, arc lamps, mercury lamps, xenon lamps, fluorescent lamps, ultraviolet light sources and sunlight, which contain radiation of a wavelength of 200–800 mμ, preferably 300 to 500 mμ.

After exposure to actinic light, the unexposed portion of the photosensitive resin layer is removed by a conventional method using various solvents or solutions, for example, water, aqueous solutions such as alkaline aqueous solutions, e.g., solutions of NaOH, $NaCO_3$, $NaHCO_3$, borax, sodium phosphate, sodium silicate, triethanolamine, or the like, or aqueous solutions of surface active agents, e.g., a soap, alkylbenzene sulfonates, alkylsulfonates, alkylamine chlorides, polyoxyalkylene glycols, polyoxyalkylene glycol alkylethers, polyoxyalkylene glycol alkylesters, sorbitan fatty acid esters, polyoxyalkylene glycol sorbitan acid esters, etc., and organic solvents such as alcohols, e.g., methanol, ethanol, isopropanol, etc., acetone, benzene or trichloroethylene. If the photosensitive layer is liquid before exposure to actinic light, the unexposed portion can also be removed by vacuum suction, scattering by centrifugal force or by blowing compressed air thereon.

The thickness of the photosensitive resin composition layer typically ranges from about 0.05 to about 5 mm and preferably from about 0.1 to about 3 mm. When the thickness of the photosensitive resin composition layer is smaller than about 0.05 mm, the resist obtained by photocuring the photosensitive resin layer is broken by a jet of hard particles in sandblast carving. On the other hand, the thickness is greater than about 5 mm, the resist becomes incompatible with the surface of an article to be carved and moreover, it becomes difficult to tightly contact the intermediate resin layer to the surface of an article to be carved by pressure. The resist is affixed to the surface of an article to be carved by the intermediate resin layer and accordingly, without any adhesion between the resist and the surface of an article to be carved, the resist may function as the protective sheet in sandblast carving but since the intermediate resin layer is broken and removed in sandblast carving and the resist ceases to be affixed to the surface of an article to be carved, it is necessary for the resist to have an adhesion to the surface of an article to be carved.

The resist obtained by photocuring the above described photosensitive resin compositon has an adhesion to conventional etchable materials to some extent but it is useful that the surface of the resist is provided with a tackifier or adhesive layer thereon.

The adhesives which can be applied to the surface of the resist in this invention may be any known adhesives including acrylic resins, polyvinyl acetate, polyvinyl methyl ether, ethylene/vinyl acetate copolymer, natural rubber, rubber hydrochloride, butadiene rubber, chloroprene rubber and silicone rubber. Of these adhesives, pressure-sensitive adhesives comprising, as the main component, an acrylic resin, natural rubber or silicone rubber are preferred. These adhesives can be applied to the surface of the resist by any conventional method such as spraying and brushing.

The entire surface of the transfer element of this invention at its resist side may be provided with a strippable protective film thereon from the viewpoint of storage and transport. The thickness of the strippable protective film used in this invention ranges from about 0.01 to about 0.2 mm. Exemplary strippable protective films include the same flexible plastic films or sheets as the above described flexible substrates and silicone-coated paper.

Exemplary etchable materials which can be employed in this invention include glass, stone, metal, ceramic ware, plastics and wood.

The transfer elements for sandblast carving of this invention advantageously have resist of very precise and fine patterns obtained from a photosensitive resin composition by the action of light and can be exactly transferred to an article to be etched by their intermediate layer.

The following Examples are to illustrate the present invention without limiting the same.

PREPARATION OF PHOTOSENSITIVE RESIN COMPOSITIONS

Photosensitive Resin Composition I

Diethylene glycol, propylene glycol, adipic acid, fumaric acid and isophthalic acid in a molar ratio of 0.80/0.20/0.65/0.10/0.25 were polycondensed at 200° C. at 90 mmHg for 8 hours in a nitrogen atmosphere to give an unsaturated polyester (acid value 35). To 100 parts by weight of this unsaturated polyester were added 35 parts by weight of diethylene glycol dimethacrylate, 5 parts by weight of 2-hydroxypropyl methacrylate, 2.5 parts by weight of benzoin ethyl ether and 0.1 part by weight of hydroquinone. These components were thoroughly mixed to form a photosensitive resin composition.

Photosensitive Resin Compositions II & III 100 parts by weight of an ethylene oxide-propylene oxide copolymer (block copolymerized diol containing 35% by weight of ethylene oxide; molecular weight of about 2,000), 100 parts by weight of polyethylene adipate diol (molecular weight of about 2,000), 26 parts by weight of tolylene diisocyanate and 0.5 part by weight of dibutyl tin laurate were mixed and heated at 70° C. for 2 hours. To the reaction mixture were added 15 parts by weight of 2-hydroxyethyl methacrylate and 0.025 part by weight of hydroquinone, and the mixture was heated at 70° C. for 2 hours to give an unsaturated polyurethane. This polyurethane was mixed with other components as shown in Table to form two photosensitive resin compositions.

TABLE

| Components | Photosensitive Resin Composition | |
|---|---|---|
| | I (parts by weight) | II (parts by weight) |
| Unsaturated polyurethane | 100 | 100 |
| 2-Hydroxyethyl methacrylate | 25 | — |
| 2-Hydroxypropyl methacrylate | — | 20 |
| Lauryl methacrylate | 7.5 | 10 |
| Tetraethylene glycol methacrylate | — | 5 |
| Polypropylene glycol monomethacrylate (molecular weight: about 1,000) | — | 10 |
| Benzoin ethyl ether | 2.5 | 2.5 |
| Hydroquinone | 0.1 | 0.1 |
| Diethylene glycol methacrylate | 7.5 | — |

EXAMPLE 1

An adhesive dope consisting of 30 parts by weight of an acrylic resin (butyl acrylate/acrylonitrile copolymer), 30 parts by weight of ethyl acetate and 40 parts by weight of toluene was coated on a polyethylene terephthalate film having a thickness of 100μ by a coater with a doctor blade and dried to form an intermediate resin layer having a thickness of 20μ.

A photopositive film was placed on a horizontal glass plate, and covered with a polyethylene terephthalate film having a thickness of 9μ. The photosensitive resin composition I was then coated on the polyethylene terephthalate film to a thickness of 2 mm. Onto the layer of the photosensitive resin composition was then laminated the above described polyethylene terephthalate film having an intermediate resin layer in such a manner that the intermediate resin layer contacted the photosensitive resin composition layer. The resulting assembly was exposed for 5 minutes from the positive film side through the glass plate to actinic light from 10 parallel arranged 20 W ultraviolet fluorescent lamps placed 10 cm away from the glass plate. The glass plate, positive film and 9μ thick polyethylene terephthalate film were then removed (stripped), and unexposed portions of the photosensitive resin composition layer were washed and removed by spraying a 1% aqueous solution of borax at 40° C. for 3 minutes at a pressure of 1 kg/cm², and the resultant was dried in a hot air stream of 50° C. for 10 minutes to form a transfer element for sandblast carving.

On a glass sheet was pressed the transfer element by a roll so that the resist surface contacted the glass surface, and then the 100μ thick polyethylene terephthalate film was slowly stripped form its edge to transfer the resist and the intermediate resin layer onto the glass surface. Then carborundum was blasted onto the entire surface of the transferred intermediate resin layer for 3 minutes by compressed air of 4 kg/cm² using a blasting machine and as a result, the resist remained on the glass surface and other portions became in a mat form. The resist were immersed in water of 50° C. and softly brushed with a brush to remove the same and the patterns corresponding to the positive film were precisely carved on the glass sheet.

EXAMPLE 2

A photopositive film bearing letter images was placed on a horizontal glass plate, and covered with a polyethylene terephthalate film having a thickness of 9μ. The photosensitive resin composition II was then coated on the polyethylene terephthalate film to a thickness of 0.5 mm. Onto the photosensitive resin composition layer was laminated the same 100μ thick polyethylene terephthalate film having an intermediate resin layer as in Example 1 so that the intermediate resin layer contacted the photosensitive resin composition layer. The resulting assembly was exposed for 3 minutes to actinic light in the same manner as in Example 1. Then the glass plate, positive film and 9μ thick polyethylene terephthalate film were removed, and unexposed portions of the photosensitive resin layer were washed and removed by spraying a 2% aqueous solution of a neutral detergent at 40° C. for 2 minutes at a pressure of 1 kg/cm², and the resultant was dried in a hot air stream of 60° C. for 7 minutes to form a transfer element for sandblast carving.

Around the outer wall of a glass was tightly wound the transfer element so that the resist contacted the glass surface, and then the 100μ thick polyethylene terephthalate was slowly stripped to transfer the resist and the intermediate resin layer onto the glass surface. In the same manner as in Example 1, sandblast carving was conducted and as a result, the patterns corresponding to the positive film were precisely carved on the glass.

EXAMPLE 3

A biaxially oriented polypropylene film having a thickness of 50μ was provided with an intermediate resin layer having a thickness of 20μ by using the same adhesive dope as in Example 1.

Precise patterns were carved on the outer surface of a glass in the same manner as in Example 2 except that the photosensitive resin composition III was employed.

EXAMPLE 4

An adhesive dope consisting of 20 parts by weight of a cellulose acetate butylate resin, 5 parts by weight of vinyl acetate, 35 parts by weight of ethyl acetate, 25 parts by weight of butyl acetate and 15 parts by weight of cellosolve was coated on a polyethylene terephthalate film having a thickness of 100μ by a coater with a doctor blade and dried to form an intermediate resin layer having a thickness of 45μ.

In the same manner as in Example 1, a transfer element for sandblast carving was obtained except that the above described polyethylene terephthalate film having the intermediate resin layer was employed and that the photopensitive resin composition was coated to a thickness of 0.3 mm.

Then a natural rubber pressure-sensitive adhesive was coated on the surface of the resist and the transfer element was adhered to a glass sheet so that the resist surface contacted the glass sheet. Then the 100μ polyethylene terephthalate film was stripped and subsequently the intermediate resin layer was stripped to transfer the resist onto the glass surface. Using a blasting machine carborundum was blasted onto the resist by compressed air of 4 kg/cm$^2$ for 2 minutes, resulting in precise patterns corresponding to the positive film on the glass surface.

While the invention has been described in detail and with reference to specific embodiments thereof, it will be apparent to one skilled in the art that various changes and modifications can be made there without departing from the spirit and scope thereof.

What is claimed is:

1. A transfer element for sandblast carving comprising, in order, a flexible substrate, an intermediate resin layer having a thickness of about 0.001 to about 1 mm which is strippable from the flexible substrate and is a pressure-sensitive adhesive to an etchable material, and a resist having a thickness of about 0.05 to about 5 mm comprising a photocured photosensitive resin, and the relationship of adhesions (a) between the flexible substrate and the intermediate resin layer, (b) between the intermediate resin layer and the resist and (c) between the resist and the etchable material being $(a)<(b)<(c)$.

2. The transfer element of claim 1, wherein the flexible substrate has a thickness of about 0.02 to about 1 mm.

3. The transfer element of claim 2, wherein the flexible substrate is a plastic sheet selected from the group consisting of polyethylene terephthalate, polyethylene, polypropylene, polyvinyl chloride and cellulose acetate.

4. The transfer element of claim 1, wherein the resist is provided with an adhesive layer thereon.

5. The transfer element of claim 1, wherein the intermediate resin layer comprises an acrylic resin.

6. The transfer element of claim 1, wherein the entire surface of the transfer element at its resist side is provided with a strippable protective film thereon.

7. The transfer element of claim 6, wherein the protective film has a thickness of about 0.01 to about 0.2 mm.

8. A process for sandblast carving which comprises:
   (i) printing a photo positive design on the photosensitive resin layer of an element comprising, in order, a flexible substrate, an intermediate resin layer which is strippable from the flexible substrate and is a pressure-sensitive adhesive to an etchable material, and a photosensitive resin layer,
   (ii) removing unexposed portions of the photosensitive resin layer to form a transfer element for sandblast carving comprising, in order, the flexible substrate, the intermediate resin layer and a resist of the photocured photosensitive resin,
   (iii) closely contacting the resist and the intermediate resin layer of the transfer element with the surface of the etchable material,
   (iv) stripping the flexible substrate from the intermediate resin layer, and
   (v) conducting sandblast operation, wherein the relationship of adhesions (a) between the flexible substrate and the intermediate resin layer, (b) between the intermediate resin layer and the resist and (c) between the resist and the etchable material being $(a)<(b)<(c)$.

* * * * *

UNITED STATES PATENT AND TRADEMARK OFFICE
CERTIFICATE OF CORRECTION

PATENT NO. : 4,430,416

DATED : February 7, 1984

INVENTOR(S) : HIRAKU GOTO et al

It is certified that error appears in the above-identified patent and that said Letters Patent is hereby corrected as shown below:

Title page:

[73] Assignees: After "Aichi" (third line) delete ", both of Japan" and insert -- ; Sango Toki Co., Ltd., Aichi, all of Japan --.

Signed and Sealed this

Eleventh Day of February 1986

[SEAL]

Attest:

DONALD J. QUIGG

Attesting Officer

Commissioner of Patents and Trademarks